(12) United States Patent
Inagaki

(10) Patent No.: US 9,793,241 B2
(45) Date of Patent: Oct. 17, 2017

(54) PRINTED WIRING BOARD

(71) Applicant: IBIDEN CO., LTD., Ogaki (JP)

(72) Inventor: Yasushi Inagaki, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/364,364

(22) Filed: Nov. 30, 2016

(65) Prior Publication Data

US 2017/0154871 A1 Jun. 1, 2017

(30) Foreign Application Priority Data

Nov. 30, 2015 (JP) ................. 2015-233454

(51) Int. Cl.
*H01L 23/48* (2006.01)
*H01L 25/065* (2006.01)
*H01L 23/498* (2006.01)
*H01L 23/31* (2006.01)
*H01L 23/552* (2006.01)

(52) U.S. Cl.
CPC ...... *H01L 25/0655* (2013.01); *H01L 23/3128* (2013.01); *H01L 23/49816* (2013.01); *H01L 23/49822* (2013.01); *H01L 23/49827* (2013.01); *H01L 23/49838* (2013.01); *H01L 23/552* (2013.01)

(58) Field of Classification Search
CPC .............................................. H01L 23/49816
See application file for complete search history.

(56) References Cited

U.S. PATENT DOCUMENTS

2013/0299218 A1* 11/2013 Inagaki ............ H01L 23/49816
174/257

FOREIGN PATENT DOCUMENTS

JP 2010-087085 A 4/2010

* cited by examiner

*Primary Examiner* — Samuel Gebremariam
(74) *Attorney, Agent, or Firm* — Oblon, McClelland, Maier & Neustadt, L.L.P.

(57) ABSTRACT

A printed wiring board includes a lowermost resin insulating layer, a first conductor layer formed on a first surface of the lowermost resin insulating layer, a conductor post formed in the lowermost resin insulating layer such that the conductor post has an upper surface facing the first surface and a lower surface on the opposite side with respect to the upper surface, a semiconductor element embedded in the lowermost resin insulating layer such that the semiconductor element has an electrode facing the first surface and is positioned on a second surface side of the lowermost resin insulating layer, and via conductors formed in the lowermost resin insulating layer and including a first via conductor and a second via conductor such that the first via conductor is connecting the first conductor layer and the conductor post and that the second via conductor is connecting the first conductor layer and the electrode.

20 Claims, 9 Drawing Sheets

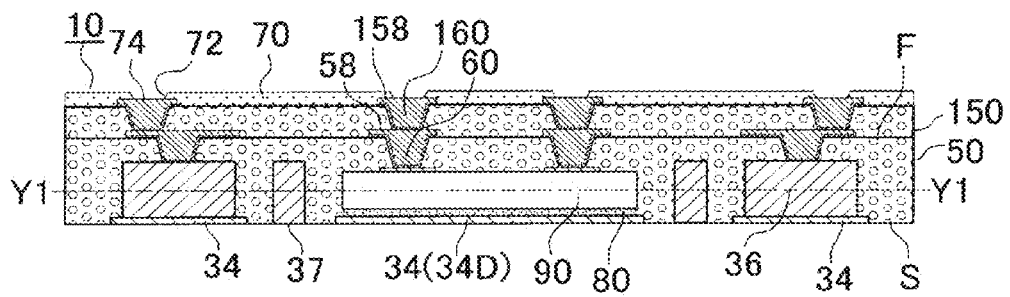
FIG. 6A
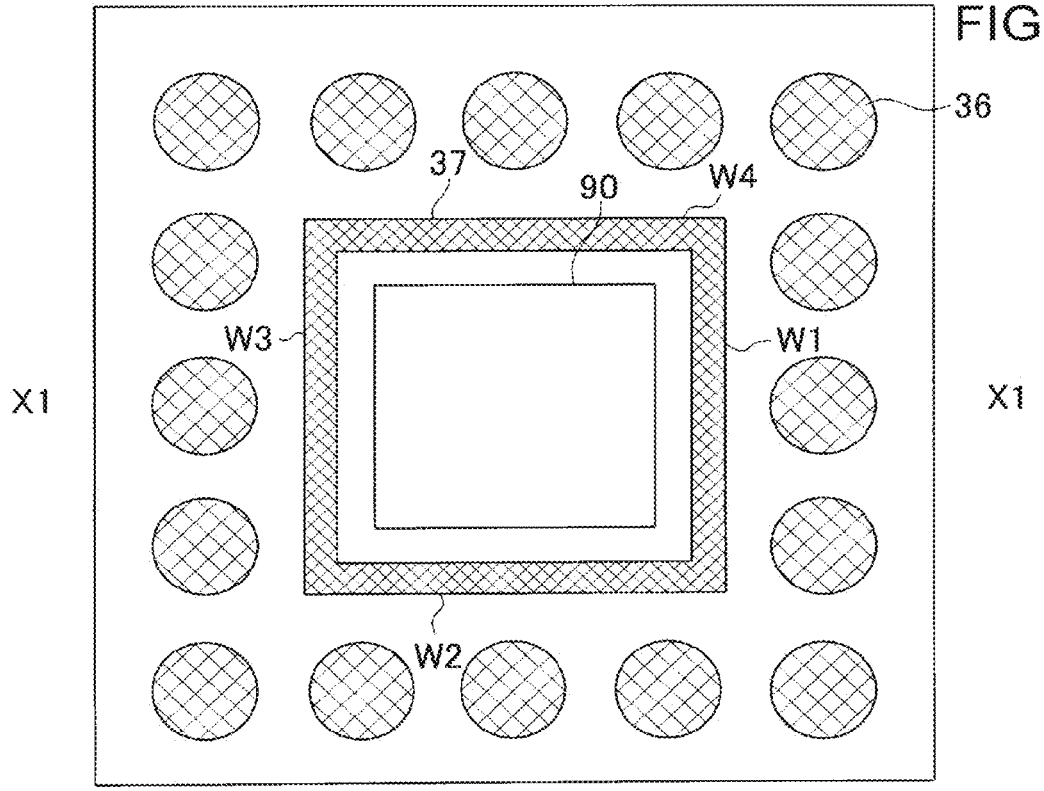
FIG. 6B
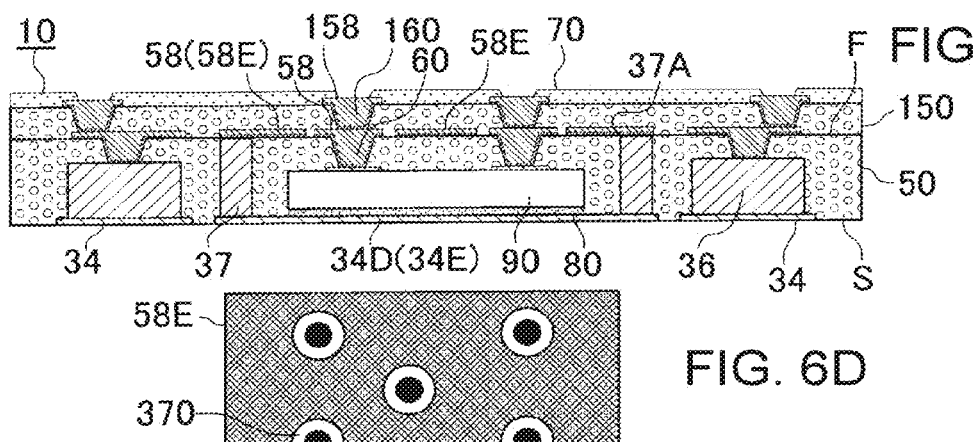
FIG. 6C
FIG. 6D

PRINTED WIRING BOARD

CROSS-REFERENCE TO RELATED APPLICATIONS

The present application is based upon and claims the benefit of priority to Japanese Patent Application No. 2015-233454, filed Nov. 30, 2015, the entire contents of which are incorporated herein by reference.

BACKGROUND OF THE INVENTION

Field of the Invention

The present invention relates to a printed wiring board with a built-in semiconductor element.

Description of Background Art

Japanese Patent Laid-Open Publication No. 2010-87085 describes a method in which an electronic component is embedded in a resin layer. According to Japanese Patent Laid-Open Publication No. 2010-87085, a through hole that penetrates two resin layers and reaches a conductor layer is formed. As illustrated in Japanese Patent Laid-Open Publication No. 2010-87085, a plating conductor is formed inside the through hole. The entire contents of this publication are incorporated herein by reference.

SUMMARY OF THE INVENTION

According to one aspect of the present invention, a printed wiring board includes a lowermost resin insulating layer, a first conductor layer formed on a first surface of the lowermost resin insulating layer, a conductor post formed in the lowermost resin insulating layer such that the conductor post has an upper surface facing the first surface and a lower surface on the opposite side with respect to the upper surface, a semiconductor element embedded in the lowermost resin insulating layer such that the semiconductor element has an electrode facing the first surface and is positioned on a second surface side of the lowermost resin insulating layer, and via conductors formed in the lowermost resin insulating layer and including a first via conductor and a second via conductor such that the first via conductor is connecting the first conductor layer and the conductor post and that the second via conductor is connecting the first conductor layer and the electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6A is a cross-sectional view of a printed wiring board according to a second embodiment of the present invention;

FIG. 6B is a plan view of the printed wiring board of the second embodiment;

FIG. 6C is a cross-sectional view of a printed wiring board of a first modified embodiment of the second embodiment;

FIG. 6D illustrates a first shield layer;

DETAILED DESCRIPTION OF THE EMBODIMENTS

Figure 1A:
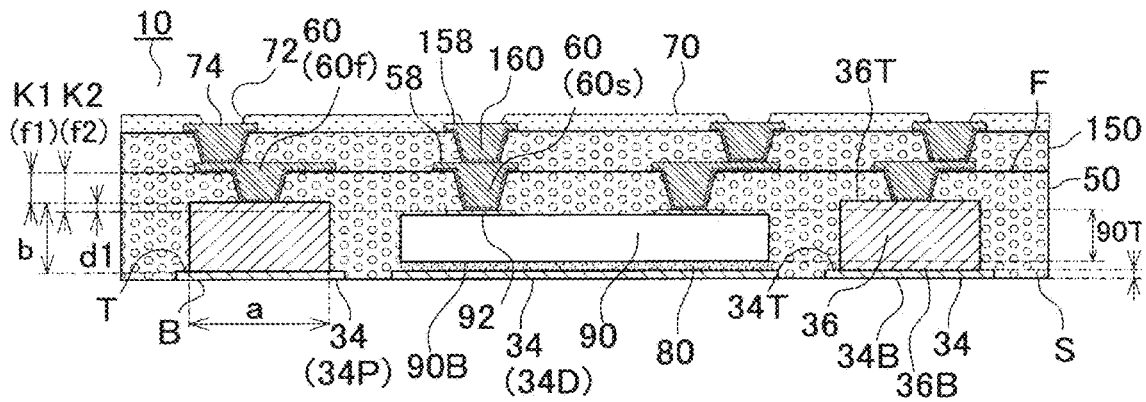
FIG. 1A illustrates a cross-sectional view of a printed wiring board according to a first embodiment of the present invention.

The embodiments will now be described with reference to the accompanying drawings, wherein like reference numerals designate corresponding or identical elements throughout the various drawings.

FIG. 1A illustrates a cross-sectional view of a printed wiring board 10 of a first embodiment.

As illustrated in FIG. 1A, the printed wiring board 10 includes: a lowermost resin insulating layer 50 that has a first surface (F) and a second surface (S) that is on an opposite side of the first surface; a semiconductor element 90 that is embedded on the second surface (S) side of the lowermost resin insulating layer 50 and has electrodes 92 facing the first surface (F); conductor posts 36 that are formed in the lowermost resin insulating layer 50; a first conductor layer 58 that is formed on the first surface (F) of the lowermost resin insulating layer 50; first via conductors 60 (60f) that are formed in the lowermost resin insulating layer 50 and connect the first conductor layer 58 and the conductor posts 36; and second via conductors 60 (60s) that connect the first conductor layer 58 and the electrodes 92 of the semiconductor element 90.

Figure 8A:
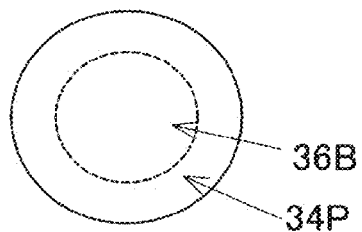
FIG. 8A is a plan view illustrating a lower surface of a conductor post and a conductor post pad.

As illustrated in FIG. 1A, the printed wiring board 10 may further include a second conductor layer 34 on the second surface. The second conductor layer 34 has a third surface (T) that opposes the first surface (F) and a fourth surface (B) that is on an opposite side of the third surface (T). A lower surface (36B) of each of the conductor posts 36 is in contact with the third surface (T). In FIG. 1A, the second conductor layer 34 is embedded in the lowermost resin insulating layer 50 and the fourth surface (B) is exposed from the second surface (S). The second conductor layer 34 has a conductor (mounting conductor) (34D) for mounting the semiconductor element 90. In the second conductor layer 34, conductors that are respectively formed below the lower surface (36B) of the conductor posts 36 are pads (conductor post pads) (34P) for the conductor posts 36. The conductor post pads (34P) each have a shape of a circular cylinder. FIG. 8A illustrates a conductor post pad (34P) and the lower surface (36B) of a conductor post 36 that is directly connected to the conductor post pad (34P). FIG. 8A is a plan view. A solid line indicates an outer periphery of the conductor post pad (34P), and a dotted line indicates an outer periphery of the lower surface (36B) of the conductor post 36. The outer periphery of the conductor post pad is positioned on an outer side of the outer periphery of the lower surface (36B) of the conductor post 36. The entire outer periphery of the conductor post pad (34P) is exposed from the conductor post 36. It is preferable that the fourth surface (B) have a rough surface.

As illustrated in FIG. 1A, the printed wiring board 10 may further include: an uppermost resin insulating layer 150 that is formed on the lowermost resin insulating layer 50 and the first conductor layer 58; an uppermost conductor layer 158 that is formed on the uppermost resin insulating layer 150; and uppermost via conductors 160 that penetrate the uppermost resin insulating layer 150 and connect the first conductor layer 58 and the uppermost conductor layer 158. The printed wiring board 10 may further include a solder resist layer 70 on the uppermost resin insulating layer 150 and the uppermost conductor layer 158. The solder resist layer 70 has openings 72 for exposing the uppermost conductor layer 158. Portions of the uppermost conductor layer 158 that are exposed by the openings 72 function as pads 74.

The electronic component 90 such as a semiconductor element is mounted on the mounting conductor circuit (34D) via a conductive paste 80. The semiconductor element 90 has a thickness (90T). The thickness (90T) is a distance between a back surface (90B) of the semiconductor element and an upper surface of each of the electrodes 92. The thickness (90T) is 50 μm or more and 150 μm or less. The semiconductor element 90 has a height (HS). The height (HS) is measured relative to the second surface (S). The height (HS) is a distance from the second surface to the upper surface of each of the electrodes 92. The height (HS) is 50 μm or more and 150 μm or less. Examples of the conductive paste 80 include a solder paste and a silver paste. A metal paste having a high thermal conductivity is used for the conductive paste 80. Heat from the semiconductor element is released to outside via the metal paste. When the fourth surface (B) of the second conductor layer 34 has a rough surface, a surface area of the fourth surface (B) is increased. Heat is transmitted from the semiconductor element to the second conductor layer 34 and is efficiently released to the outside via the rough surface of the second conductor layer 34. Fins for heat dissipation can be attached on the fourth surface (B) of the second conductor layer 34. Malfunction of the semiconductor element can be prevented.

The conductor posts 36 each extend from the second surface (S) toward the first surface (F), and each have an upper surface (36T) that faces the first surface (F) and the lower surface (36B) that is on an opposite side of the upper surface. The lower surface (36B) faces the second surface (S). The conductor posts 36 each have a length (b). The length (b) is a distance between the upper surface (36T) and the lower surface (36B). The length (b) is 50 μm or more and 200 μm or less. There is a distance (K3) between the lower surface (36B) and the second surface (S). There is a distance (K1) between the upper surface (36T) and the first surface (F). The distance (K1) is larger than the distance (K3). The distance (K1) is larger than 0. The distance (K3) is 0 or more. There is a distance (K2) between the upper surface of each of the electrodes 92 of the semiconductor element 90 and the first surface (F). An example of a shape of each of the conductor posts 36 is a circular cylinder. The conductor posts 36 each have a diameter (a) of 50 μm or more and 200 μm or less. The conductor posts 36 each have a height (HP). The height (HP) is measured relative to the second surface (S). The height (HP) is a distance from the second surface (S) to the upper surface (36T). The height (HP) is 50 μm or more and 150 μm or less. The conductor posts 36 surround the semiconductor element 90. It is preferable that the printed wiring board 10 include at least two rows of conductor posts 36. It is preferable that the number of conductor posts for grounding among conductor posts 36 belonging to a row closest to the semiconductor element 90 be larger than the number of conductor posts for grounding among conductor posts 36 belonging to a row farthest from the semiconductor element 90. The conductor posts for grounding are electrically connected to the ground. All of the conductor posts 36 belonging to the row closest to the semiconductor element 90 may be conductor posts for grounding. The semiconductor element 90 is shielded.

The lowermost resin insulating layer 50 has openings (51f) for the first via conductors 60 (60f) respectively extending from the first surface (F) of the lowermost resin insulating layer 50 to the upper surfaces (36T) of the conductor posts 36. The openings (51f) each have a depth (f1). The depth (f1) is equal to the distance (K1). The depth (f1) is 5 μm or more and 50 μm or less.

The lowermost resin insulating layer 50 has openings (51s) for the second via conductors 60 (60s) respectively extending from the first surface (F) of the lowermost resin insulating layer 50 to the upper surfaces of the electrodes of the semiconductor element. The openings (51s) each have a depth (f2). The depth (f2) is equal to the distance (K2). The depth (f2) is 5 μm or more and 50 μm or less.

Figure 3A:
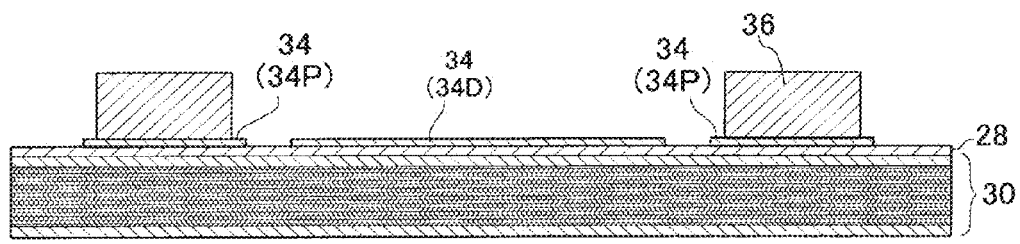
FIG. 3A-3D are manufacturing process diagrams of the printed wiring board of the first embodiment.
Figure 3B:
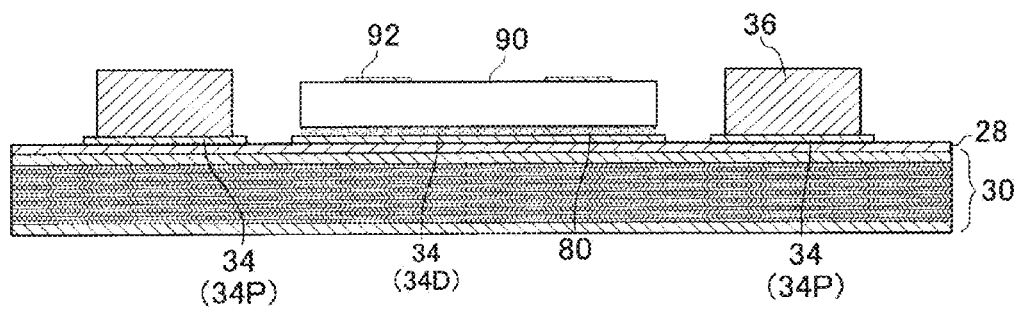
Figure 3C:
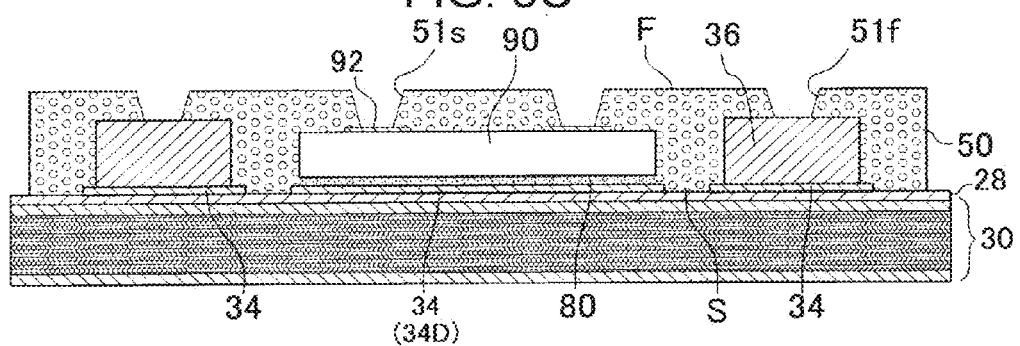
Figure 3D:
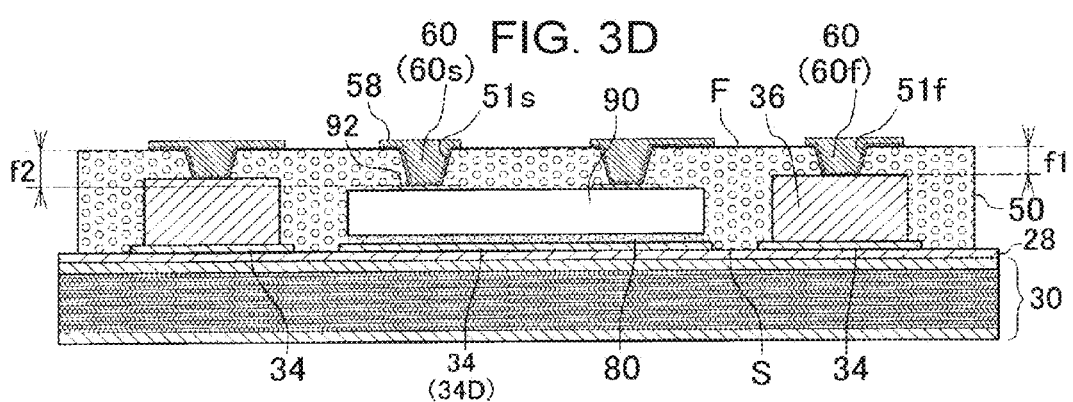

As illustrated in FIG. 3D, the first via conductors 60 (60f) are formed in the openings (51f). Therefore, the first via conductors (60f) each have a length (f1). The length (f1) and the depth (f1) are equal to each other. The first via conductors (60f) are respectively connected to the upper surfaces (36T) of the conductor posts 36.

As illustrated in FIG. 3D, the second via conductors (60s) are formed in the openings (51s). Therefore, each of the second via conductors (60s) has a length (f2). The length (f2) and the depth (12) are equal to each other. The second via conductors (60s) are respectively connected to the upper surfaces of the electrodes of the semiconductor element 90.

It is preferable that the height (HP) of the conductor posts 36 and the height (HS) of the semiconductor element 90 are equal to each other. The length (f1) of the first via conductors (60f) and the length (f2) of the second via conductors (60s) become equal to each other. Therefore, even when the printed wiring board 10 is subjected to heat cycles, a stress is unlikely to concentrate on the first via conductors (60f) or on the second via conductors (60s). Reliability of connection via the first via conductors (60f) or the second via conductors (60s) is unlikely to be reduced. Further, the openings (51f) and the openings (51s) can be formed under the same conditions. A process is simplified.

Strength of the semiconductor element 90 that is formed in a central region of the printed wiring board 10 is higher than strength of the conductor posts 36 that are formed in an outer periphery region of the printed wiring board 10. Therefore, strength of the outer periphery region of the printed wiring board is likely to be lower than strength of the central region of the printed wiring board. When the difference in strength is large, a crack is likely to occur in the lowermost resin insulating layer 50 between the semiconductor element 90 and the conductor posts 36. In order to prevent occurrence of a crack, it is desirable that the difference in strength be small. For example, the difference in strength can be reduced by increasing a volume of each of the conductor posts 36. When the length (b) of the conductor posts 36 and the diameter (a) of the conductor posts are large, the difference in strength can be reduced. Among the length (b) and the diameter (a), when the diameter (a) is increased, a size of the printed wiring board 10 is increased. When the size of the printed wiring board 10 is large, warpage or undulation of the printed wiring board 10 is likely to increase. Therefore, it is difficult to prevent occurrence of a crack by increasing the diameter (a). In contrast, even when the length (b) is increased, the size of the printed wiring board 10 is not significantly changed. Therefore, it is preferable to prevent occurrence of a crack by adjusting the length (b). By making the length (b) larger than the thickness (90T), a crack becomes unlikely to occur.

The semiconductor element 90 is embedded on the second surface (S) of the lowermost resin insulating layer 50. Therefore, strength of the second surface (S) side of the lowermost resin insulating layer 50 is higher than strength of the first surface (F) side of the lowermost resin insulating layer 50. A position of the semiconductor element 90 in the lowermost resin insulating layer 50 is a cause of a crack. A diameter of each of the conductor posts 36 is larger than a diameter of each of the first via conductors (60f). Therefore, by increasing the height (HP), the strength of the first surface (F) side of the lowermost resin insulating layer 50 is increased. Therefore, it is expected that, by increasing the height (HP), occurrence of a crack due to the position of the semiconductor element 90 is suppressed. Therefore, when the height (HP) and the height (HS) are different from each other, it is preferable that the height (HP) be higher than the height (HS). It is preferable that the length (f1) of the first via conductors (60f) be shorter than the length (f2) of the second via conductors (60s). In the present embodiment, the first surface (F) and the second surface (S) side are connected to each other via the conductor posts 36 and the first via conductors (60f). Therefore, the height of the conductor posts 36 can be easily adjusted. When the height (HP) is higher than the height (HS), a difference (d1) between the height (HP) and the height (HS) is 20 μm or less. When the difference (d1) exceeds 20 μm, a difference between the length of the first via conductors (60f) and the length of the second via conductors (60s) is too large. A stress is likely to concentrate on the first via conductors (60f) or the second via conductors (60s). Reliability of connection via the via conductors (60f, 60s) is likely to deteriorate.

It is desirable that a ratio (K1/K2) of the distance (K1) to the distance (K2) be 0.6 or more and 0.9 or less. When the ratio (K1/K2) is less than 0.6, the difference between the length of the first via conductors (60f) and the length of the second via conductors (60s) is too large. The connection reliability deteriorates. When the ratio (K1/K2) exceeds 0.9, the effect achieved by increasing the volume of the conductor posts 36 is decreased.

When the height (HS) is higher than the height (HP), a difference (d2) (FIG. 1C) between the height (HP) and the height (HS) is 10 μm or less. When the difference (d2) exceeds 10 μm, the difference in strength is too large. Reliability of the connection via the via conductors (60f, 60s) deteriorates.

The printed wiring board 10 of the first embodiment accommodates the semiconductor element 90 in the lowermost resin insulating layer 50. Therefore, a thickness of the lowermost resin insulating layer 50 is likely to increase. When conductors on the first surface (F) side of the lowermost resin insulating layer 50 and conductors on the second surface (S) side are connected only via the via conductors, the length of the via conductors is increased. The openings for the via conductors are deep and thus it becomes technologically difficult to form the via conductors. Large voids are likely to occur in the via conductors. Films that form the via conductors become thin. As a result, reliability of the connection via the via conductors is decreased. In contrast, in the present embodiment, the conductors on the first surface (F) side of the lowermost resin insulating layer 50 and the conductors on the second surface (S) side are connected via the conductor posts 36 and the first via conductors (60f). An example of the conductor son the first surface (F) side is the first conductor layer. Examples of the conductors on the second surface (S) side are the lower surfaces (36B) of the conductor posts 36 and the second conductor layer 34. Due to the presence of the conductor posts 36, the depth of the openings (51f) for the first via conductors (60f) is reduced. The openings (51f) can be easily filled with plating. The first via conductors (60f) do not contain voids. Or, the first via conductors (60f) do not contain voids related to the connection reliability. Further, the second conductor layer 34 is embedded in the lowermost resin insulating layer 50. The conductor posts 36 are formed on the second conductor layer 34. Therefore, the height (HP) of the conductor posts 36 can be easily increased. Therefore, when the printed wiring board 10 has the second conductor layer 34 that is embedded in the lowermost resin insulating layer 50, the connection reliability of the printed wiring board 10 is likely to be high.

Figure 5A:
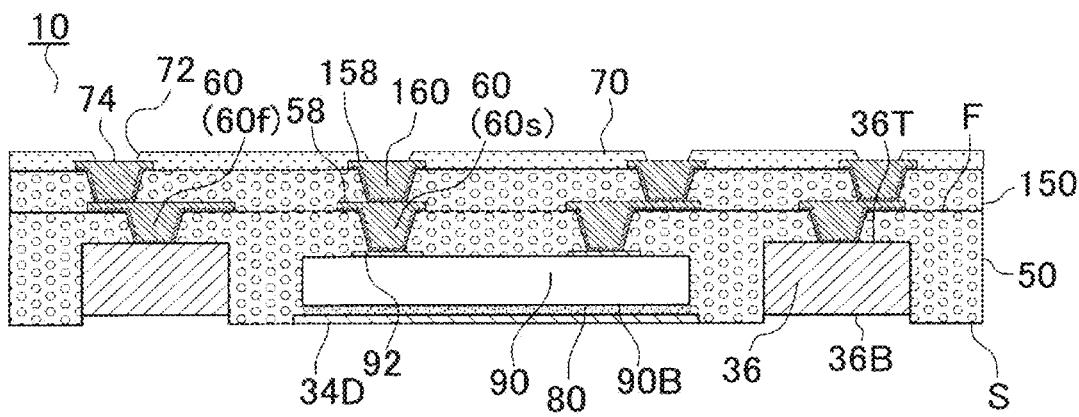
FIG. 5A-5C are cross-sectional views of printed wiring boards of modified embodiments of the first embodiment.

FIG. 5A illustrates a cross section of a printed wiring board according to a first modified embodiment of the first embodiment.

In the first modified embodiment of the first embodiment, the second conductor layer 34 is not formed below the lower surfaces (36B) of the conductor posts 36. The lower surfaces (36B) of the conductor posts 36 are exposed from the second surface (S) of the lowermost resin insulating layer 50. As illustrated in FIG. 5A, the lower surfaces (36B) of the conductor posts 36 are recessed from the second surface (S) of the lowermost resin insulating layer 50.

In FIG. 5A, the second conductor layer 34 is formed by the mounting conductor circuit (34D) only. In the first modified embodiment of the first embodiment, the lower surfaces (36B) of the conductor posts 36 are exposed to the outside. Therefore, when the printed wiring board 10 of the first modified embodiment of the first embodiment is connected to a motherboard or an electronic component, data is transmitted to the conductor posts 36 without passing through the second conductor layer. The data is unlikely to deteriorate. Further, the lower surfaces (36B) of the conductor posts 36 function as terminals for connecting to a motherboard or an electronic component. Since the second conductor layer 34 is not formed below the lower surfaces (36B) of the conductor posts 36, distances between adjacent conductor posts 36 are shortened. The size of the printed wiring board can be reduced. A high density printed wiring board can be provided. Warpage of the printed wiring board is reduced. A sophisticated electronic component or motherboard can be mounted on the printed wiring board 10. The mounting conductor circuit (34D) can be removed from the printed wiring board 10 of FIG. 5A. In this case, the printed wiring board 10 does not have the second conductor layer 34. The lower surfaces (36B) of the conductor posts 36 and the conductive paste 80 are exposed. The lower surfaces (36B) of the conductor posts 36 and the conductive paste 80 may be recessed from the second surface (S) of the lowermost resin insulating layer 50.

Figure 5B:
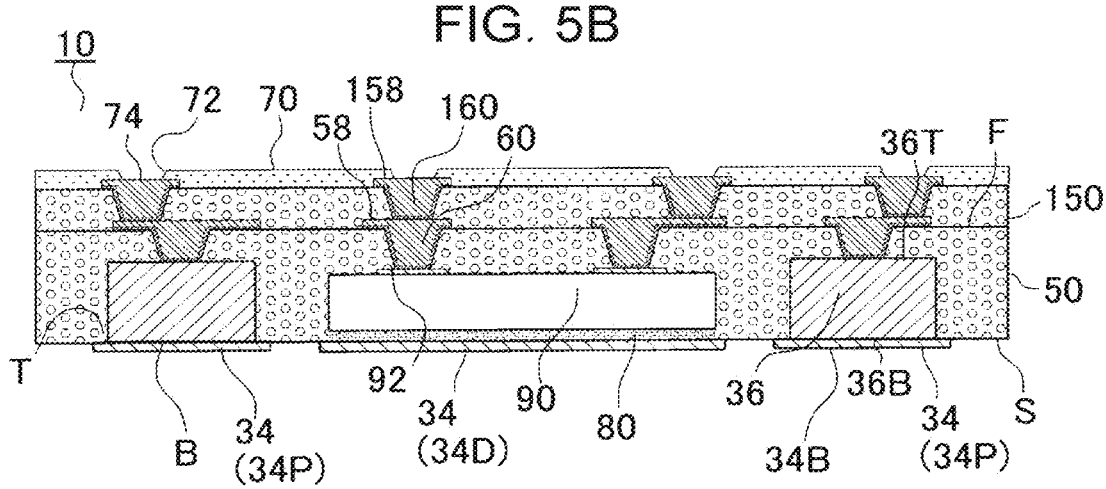

FIG. 5B illustrates a cross section of a printed wiring board according to a second modified embodiment of the first embodiment. In FIG. 1A, the second conductor layer 34 is embedded in the lowermost resin insulating layer 50. In contrast, in FIG. 5B, the second conductor layer 34 protrudes from the second surface (S) of the lowermost resin insulating layer 50. Other than that, the printed wiring board 10 of FIG. 1A and the printed wiring board 10 of FIG. 5B are the same.

Figure 5C:
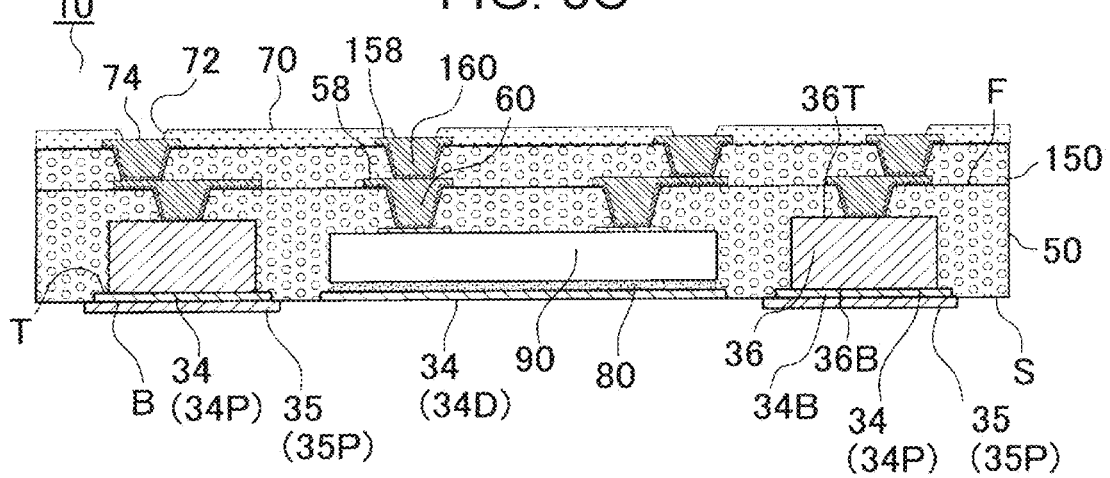
Figure 8B:
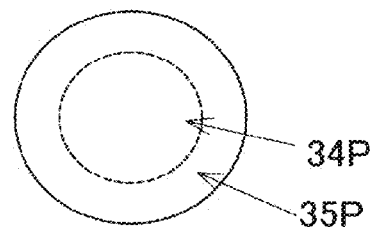
FIG. 8B is a plan view illustrating a conductor post pad and a lowermost pad.

FIG. 5C illustrates a cross section of a printed wiring board according to a third modified embodiment of the first embodiment. In FIG. 5C, a lowermost conductor layer 35 is added to the printed wiring board 10 of FIG. 1A. The lowermost conductor layer 35 is formed on the fourth surface (B) of the second conductor layer 34 and on the second surface (S) of the lowermost resin insulating layer 50. The lowermost conductor layer 35 has lowermost pads (35P) that respectively connect to the conductor post pads (34P). The conductor post pads (34P) and the lowermost pads (35P) are respectively directly connected to each other. The lowermost pads (35P) each have a shape of a circular cylinder. FIG. 8B illustrates plan views of a conductor post pad (34P) and a lowermost pad (35P). FIG. 8B illustrates a size of the conductor post pad (34P) and a size of the lowermost pad (35P). An outer periphery of the lowermost pad (35P) is indicated using a solid line, and an outer periphery of the conductor post pad (34P) is indicated using a dotted line. The lowermost pad (35P) is larger than the conductor post pad (34P). It is preferable that the lowermost conductor layer 35 be formed by the lowermost pads (35P) only. When the lowermost conductor layer 35 does not have a conductor circuit below the mounting conductor circuit (34D), the difference in strength between the central region and the outer periphery region is reduced. Further, distanced between the semiconductor element 90 and the conductor post pads (34P) can be reduced. The size of the printed wiring board 10 can be reduced. When the lowermost conductor layer 35 has a conductor circuit below the mounting conductor circuit (34D), heat from the semiconductor element can be efficiently released.

Second Embodiment

FIG. 6A is a cross-sectional view of a printed wiring board according to a second embodiment of the present invention. FIG. 6B is a plan view of the printed wiring board of the second embodiment. FIG. 6B is obtained by cutting the printed board 10 of FIG. 6A with a plane that is parallel to the first surface (F) and passes through a position (Y1) illustrated in FIG. 6A. FIG. 6A is a cross-sectional view of the printed circuit board 10 between points (X1, X1) in FIG. 6B.

In the printed circuit board of the second embodiment, a shield structure (shield structure of a first example) 37 is added to the printed wiring board 10 of FIG. 1A. As illustrated in FIG. 6B, the shield structure 37 is formed between the semiconductor element 90 and the conductor posts 36. The shield structure 37 completely surrounds the semiconductor element. The semiconductor element 90 is surrounded by the shield structure 37 that is formed by four walls (W1, W2, W3, W4). As illustrated in FIGS. 6A and 6B, the shield structure 37 of FIG. 6A is formed by four walls (W1, W2, W3, W4). It is preferable that a height of the shield structure and the height of the conductor posts be substantially equal to each other. It is preferable that the shield structure 37 be formed of a conductor and be connected to the ground. The semiconductor element 90 is shielded by the shield structure. Therefore, data transmitted through the conductor posts 36 is unlikely to be deteriorated by electromagnetic waves from the semiconductor element 90.

FIG. 6C illustrates a cross section of a printed wiring board according to a first modified embodiment of the second embodiment.

In the first modified embodiment of the second embodiment, a size of the mounting conductor (mounting conductor circuit) (34 D) is larger than a size of the semiconductor element 90. Further, the shield structure (shield structure of a second example) 37 is electrically connected to the mounting conductor circuit (34D) and penetrates the lowermost resin insulating layer 50. The shield structure 37 is formed on the mounting conductor circuit (34D). The shield structure 37 is formed in an outer peripheral region of the mounting conductor circuit (34D). Since the shield structure 37 and the mounting conductor circuit (34D) are connected to each other, the mounting conductor circuit (34D) functions as a shield layer (second shield layer) (34E). The first conductor layer 58 has a first shield layer (58E) that is electrically connected to the shield structure 37. The first shield layer (58E) is formed on the first surface (F) of the lowermost resin insulating layer 50 such that the semiconductor element 90 is covered by the first shield layer (58E). Further, the first shield layer (58 E) opposes the second shield layer (34 E). The semiconductor element 90 is sandwiched between the first shield layer (58E) and the second shield layer (34E). The semiconductor element 90 is surrounded by the shield structure 37. The semiconductor element 90 is sterically shielded by the shield structure 37 and the shield layers (58E, 34E). Therefore, data transmitted through the conductor posts 36 is unlikely to be deteriorated by electromagnetic waves from the semiconductor element 90. The first shield layer (58E), the second shield layer (34E) and the shield structure 37 are electrically connected to the ground. FIG. 6D illustrates an example of the first shield layer (58E). The shield layer (58E) has openings 370. Lands (60sL) of the second via conductors (60s) are respectively formed in the openings 370.

Figure 7A:
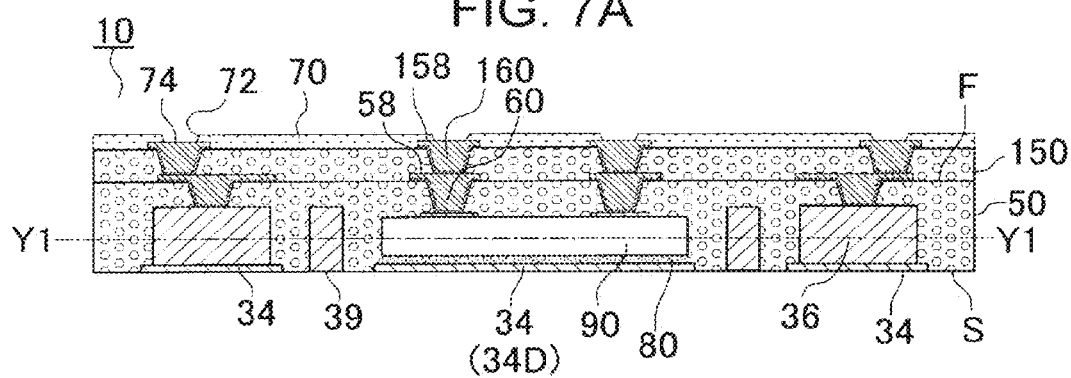
FIGS. 7A and 7B illustrate a third example of a shield structure.
Figure 7B:
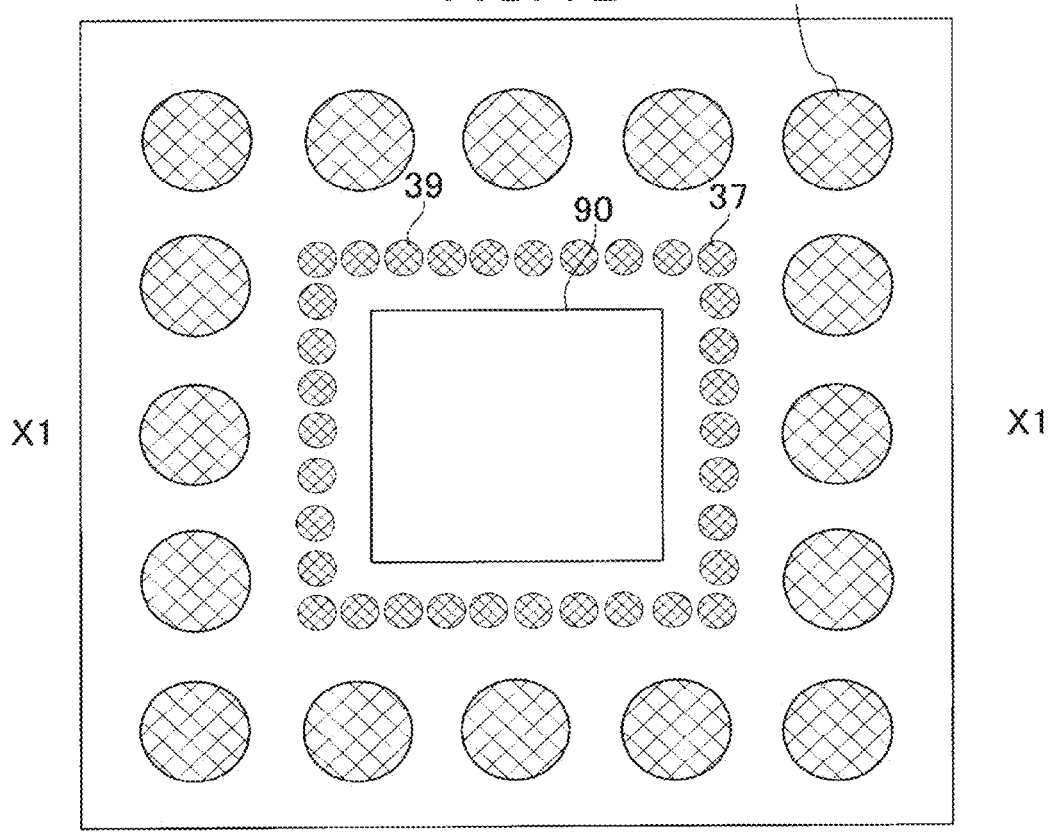

In the shield structure 37 of FIG. 6B, the shield structure is continuous. In contrast, in a third example of the shield structure 37 illustrated in FIGS. 7A and 7B, the shield structure 37 is formed by multiple shield conductor posts 39. Similar to FIG. 6B, the plan view of FIG. 7B is obtained by cutting the printed wiring board of FIG. 7A with a plane passing through a position (Y1).

The shield conductor posts 39 of the third example do not penetrate the lowermost resin insulating layer 50. A diameter of each of the shield conductor posts 39 is smaller than the diameter of each of the conductor posts 36. Even when the printed board 10 has the shield structure 37, the size of the printed board is unlikely to increase. Except for the shape of the shield structure 37, the printed wiring board of FIG. 6A and the printed wiring board of FIG. 7A are the same. A height of the shield conductor posts 39 and the height of the conductor posts 36 are substantially equal to each other.

Figure 7C:
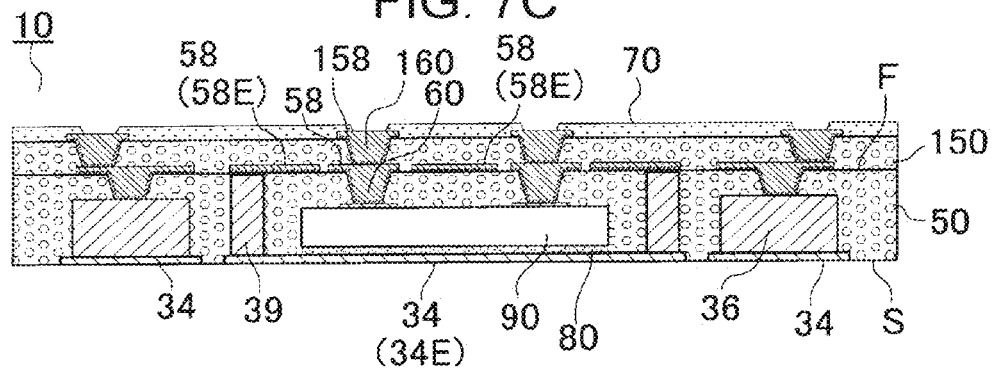
FIG. 7C illustrates a fourth example of the shield structure.

In the shield structure 37 of FIG. 6C, the shield structure is continuous. In contrast, in a fourth example of the shield structure 37 illustrated in FIG. 7C, the shield structure 37 is formed by multiple shield conductor posts 39. The shield conductor posts 39 of the fourth example penetrate the lowermost resin insulating layer 50. A diameter of each of the shield conductor posts 39 is smaller than the diameter of each of the conductor posts 36. Even when the printed board 10 has the shield structure 37, the size of the printed board is unlikely to increase. Except for the shape of the shield structure, the printed wiring board of FIG. 6C and the printed wiring board of FIG. 7C are the same. Therefore, the printed wiring board of FIG. 7C has the first shield layer (58E) and the second shield layer (34E) that are connected to the shield structure 37 of the fourth example.

Figure 8C:
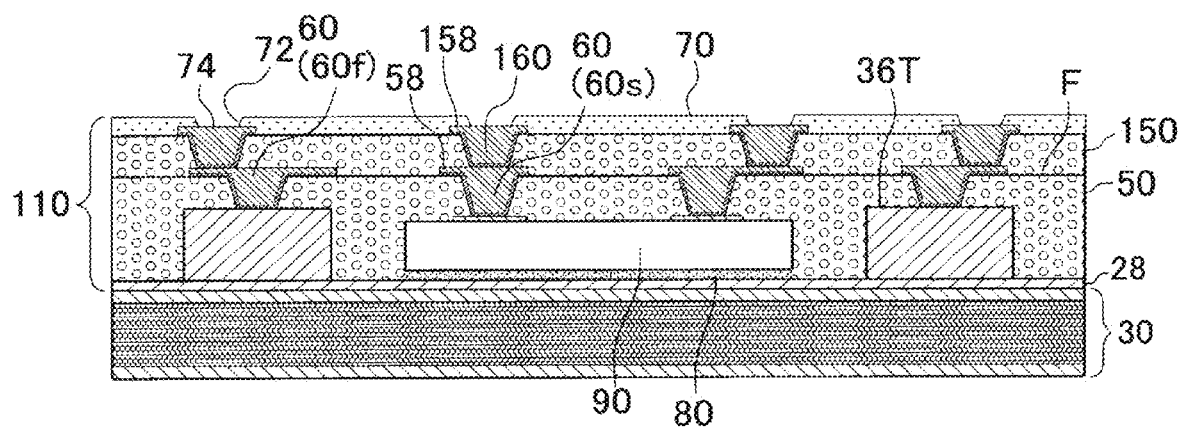
FIG. 8C is a cross-sectional view of an intermediate substrate of a second modified embodiment of the first embodiment.
Figure 8D:
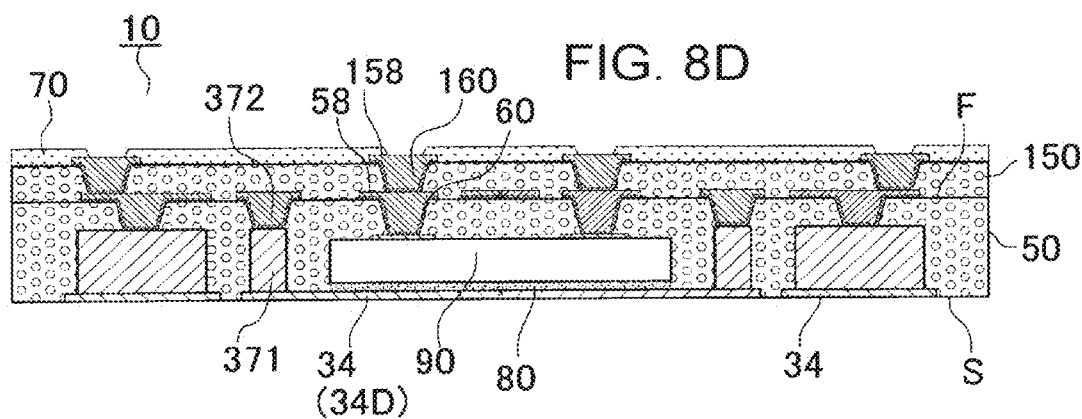
FIG. 8D is a cross-sectional view of a fifth example of the shield structure.

A fifth example of the shield structure 37 is illustrated in FIG. 8D. In the fifth example, the shield structure 37 is formed by a first shield structure 371 and a second shield structure 372 that is formed on the first shield structure 371. The first shield structure 371 and the conductor posts 36 are formed at the same time. A process is simplified. A height of the first shield structure 371 and the height of the conductor posts 36 are substantially equal to each other. The second shield structure 372 and the first via conductors (60f) are formed at the same time. A process is simplified. A length of the second shield structure 372 and the length of the first via conductors (60f) are substantially equal to each other. The first shield structure 371 is formed by a wall. Alternatively, the first shield structure 371 is formed by the shield conductor posts 39. The second shield structure 372 is formed by a wall. Alternatively, the second shield structure 372 is formed by via conductors that are respectively formed on the shield conductor posts.

Figure 8E:
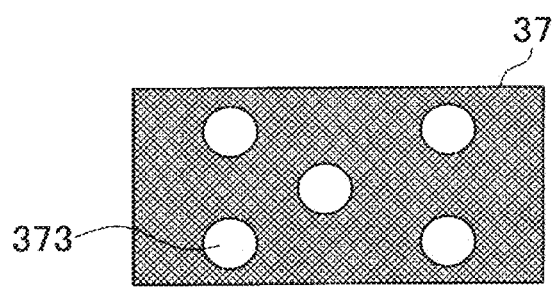
FIG. 8E illustrates a shield structure having openings.

The printed wiring board of the second embodiment can adopt the printed wiring board of the first embodiment or the printed wiring board of each of the modified embodiments of the first embodiment. The printed wiring board of each of the modified embodiments of the second embodiment can adopt the printed wiring board of the first embodiment or the printed wiring board of each of the modified embodiments of the first embodiment. The shield structure 37 increases the strength of the lowermost resin insulating layer 50 that is formed between the conductor posts 36 and the semiconductor element 90. A crack is unlikely to occur in the lowermost resin insulating layer 50 that is formed between the conductor posts 36 and the semiconductor element 90. As illustrated in FIG. 8E, the shield structure 37 that is formed by a wall may have opening 373. The lowermost resin insulating layer 50 that is formed between the shield structure 37 and the semiconductor element 90 and the lowermost resin insulating layer 50 that is formed outside the shield structure 37 are connected in the openings 373 of the shield structure 37. Even when the printed board has the shield structure 37, a defect such as a crack is unlikely to occur in the lowermost resin insulating layer 50.

Method for Manufacturing Printed Wiring Board

FIG. 2A-4D illustrate a method for manufacturing the printed wiring board of the first embodiment.

Figure 2A:
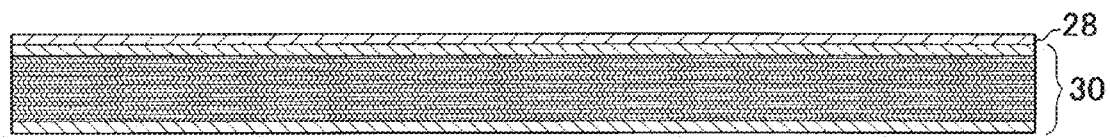
FIG. 2A-2D are manufacturing process diagrams of the printed wiring board of the first embodiment.
Figure 2B:
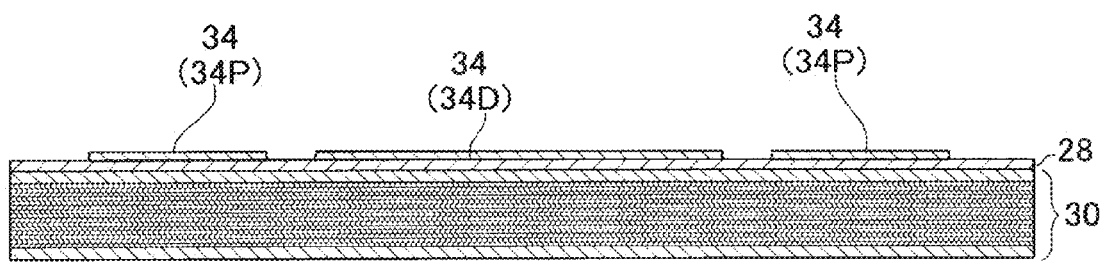
Figure 2C:
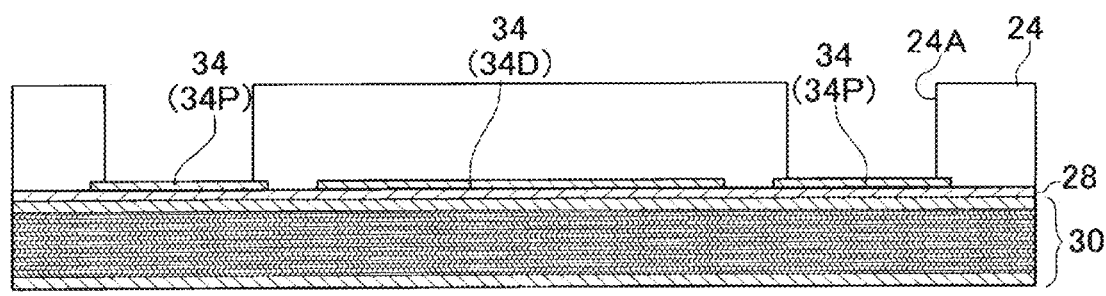
Figure 2D:
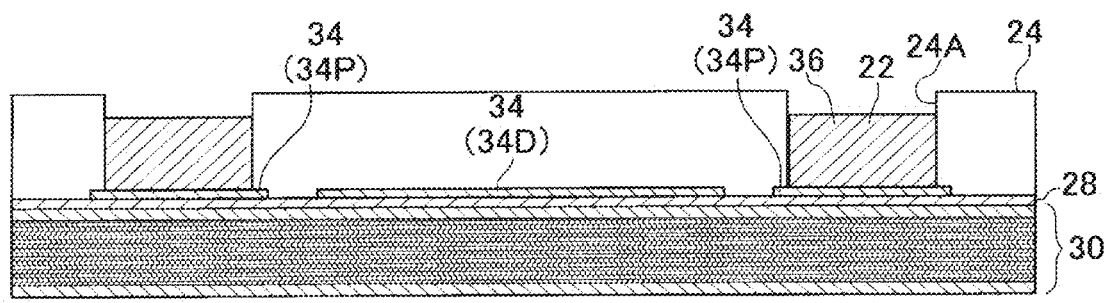

A support plate 30 is prepared. An example of the support plate 30 is a double-sided copper-clad laminated plate. A copper foil 28 is laminated on the support plate 30 (FIG. 2A). A plating resist is formed on the copper foil 28. An electrolytic copper plating film is formed by electrolytic copper plating on the copper foil 28 that is exposed from the plating resist. The plating resist is removed. The second conductor layer 34 is formed from the electrolytic copper plating film (FIG. 2B). The second conductor layer 34 includes the mounting conductor circuit (34D) and the conductor post pads (34P). A plating resist 24 having openings (24A) is formed on the copper foil 28 and the second conductor layer 34 (FIG. 2C). The openings (24A) partially expose the conductor post pads (34P). The openings (24A) are each filled with plating 22. The conductor posts 36 are respectively formed on the conductor post pads (34P) (FIG. 2D).

The plating resist 24 is removed. The conductor posts 36 are exposed (FIG. 3A). The semiconductor element 90 is mounted in the mounting conductor circuit (34D) via the conductive paste 80 (FIG. 3B). The semiconductor element 90 is mounted on the conductive paste 80 such that the electrodes 92 face upward. The lowermost resin insulating layer 50 is formed on the copper foil 28, the second conductor layer 34 and the semiconductor element 90. The lowermost resin insulating layer 50 has the second surface (S) and the first surface (F) that is on an opposite side of the second surface. The second surface (S) opposes the copper foil 28. The second conductor layer 34 and the semiconductor element 90 are embedded on the second surface (S) of the lowermost resin insulating layer 50. The openings (51f) for the first via conductors reaching the conductor posts 36 and the openings (51s) for the second via conductors reaching the electrodes 92 of the semiconductor element 90 are formed in the lowermost resin insulating layer 50 using laser (FIG. 3C). An electroless plating film is formed on the first surface of the lowermost resin insulating layer 50 and in the openings (51f, 51s) for the via conductors. Thereafter, a plating resist is formed on the electroless plating film. An electrolytic plating film is formed on the electroless plating film that is exposed from the plating resist. The openings (51f, 51s) are filled with the electrolytic plating, and the first via conductors (60f) and the second via conductors (60s) are formed. The plating resist is removed. The electroless plating film that is exposed from the electrolytic plating film is removed and the first conductor layer 58 is formed (FIG. 3D). Since the semiconductor element 90 is accommodated, the lowermost resin insulating layer 50 is likely to become thick. However, the present embodiment has conductor posts 36. Therefore, the openings (51f) for the first via conductors become shallow. The openings (51f) for the first via conductors are easily filled with the plating. The openings (51s) for the second via conductors reach the electrodes 92 of the semiconductor element 90. The openings (51s) for the second via conductors are easily filled with the plating. Reliability of the connection via the via conductors (60f, 60s) is increased.

Figure 4A:
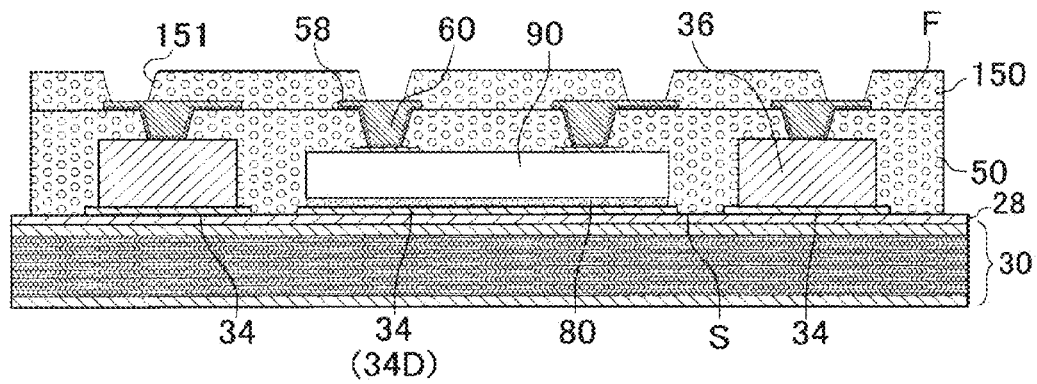
FIG. 4A-4D are manufacturing process diagrams of the printed wiring board of the first embodiment.
Figure 4B:
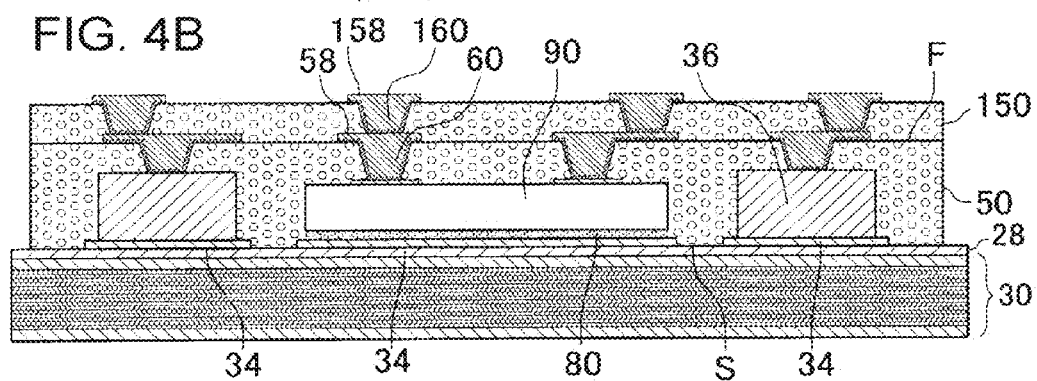
Figure 4C:
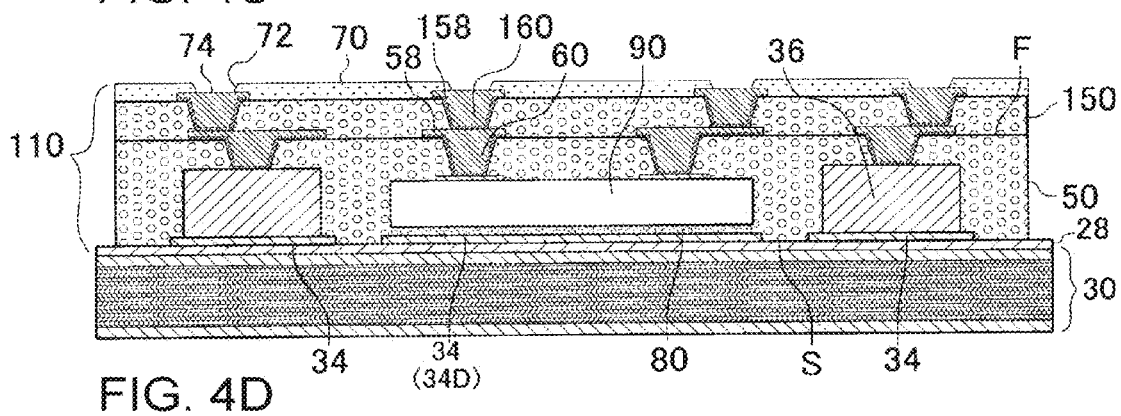

The uppermost resin insulating layer 150 is formed on the lowermost resin insulating layer 50 and the first conductor layer 58. Openings 151 for via conductors reaching the first conductor layer 58 are formed in the uppermost resin insulating layer 150 using laser (FIG. 4A). The uppermost conductor layer 158 and the uppermost via conductors 160 are formed by a process same as that of FIG. 3D (FIG. 4B). The solder resist layer 70 having the openings 72 that expose the pads 74 is formed on the uppermost resin insulating layer 150 (FIG. 4C). An intermediate substrate 110 illustrated in FIG. 4C is formed on the support plate 30. The intermediate substrate 110 of FIG. 4C is formed by the printed wiring board 10 of FIG. 1A and the copper foil 28.

Figure 1B:
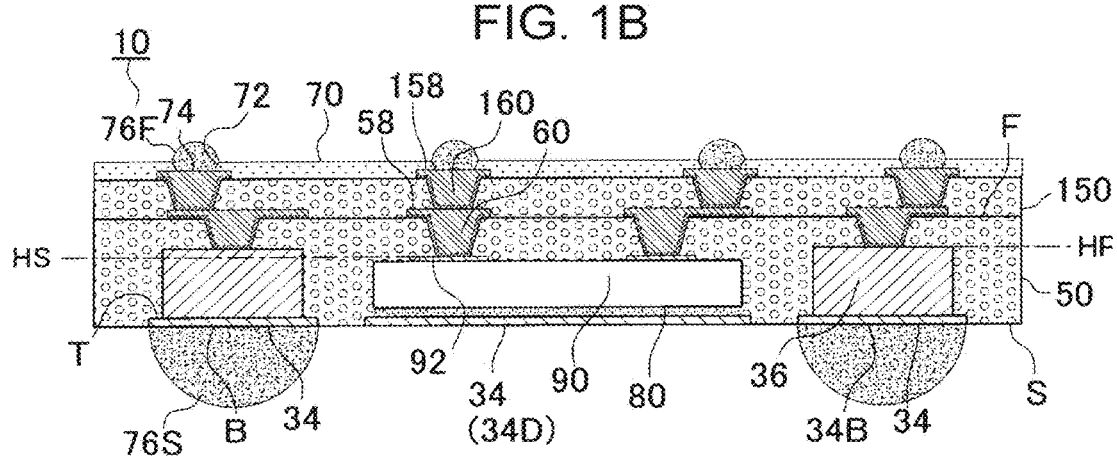
FIG. 1B illustrates a cross-sectional view of a printed wiring board having solder bumps.
Figure 1C:
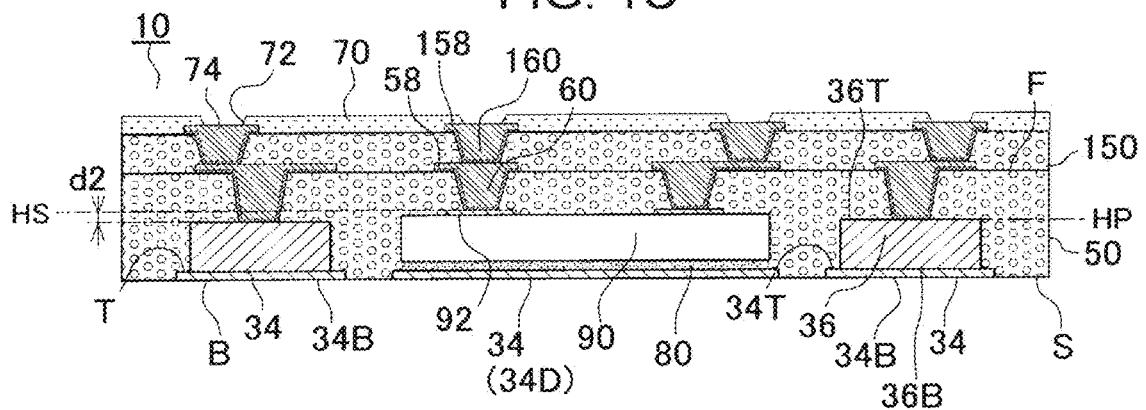
FIG. 1C illustrates a difference (d2) between heights (HP, HS)
Figure 4D:
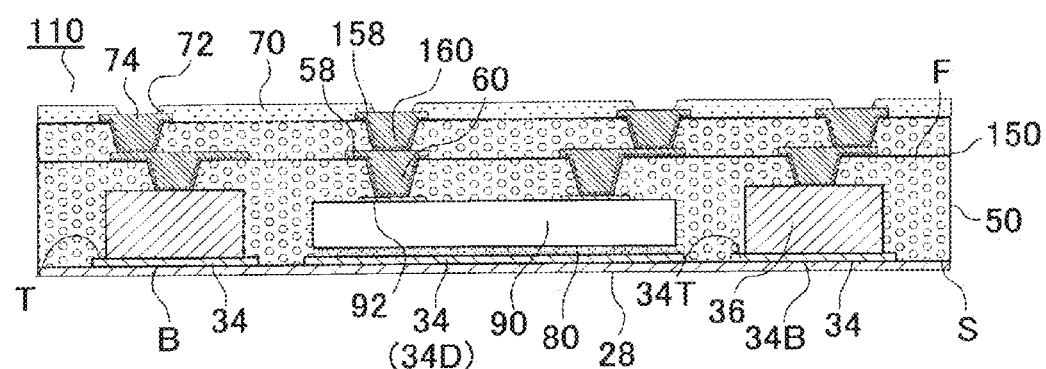

The intermediate substrate 110 is separated from the support plate 30 (FIG. 4D). The copper foil 28 is removed from the intermediate substrate 110. The printed wiring board 10 illustrated in FIG. 1A is completed. When solder bumps (76F, 76S) are formed on the pads 74 and the conductor post pads (34P), a printed wiring board having the solder bumps illustrated in FIG. 1B is completed.

A protective film is affixed on the solder resist layer 70 and the pads 74 of the printed wiring board illustrated in FIG. 1A. A protective film is affixed on the mounting conductor circuit (34D) in the second conductor layer 34. Thereafter, the conductor post pads (34P) are removed. The protective film is removed. The printed wiring board 10 illustrated in FIG. 5A is completed. When the second conductor layer 34 is removed without forming the protective film on the second surface (S), the mounting conductor circuit (34D) is removed from the printed wiring board 10 illustrated in FIG. 5A.

Method for Manufacturing Printed Wiring Board According to Second Modified Embodiment of First Embodiment The support plate 30 and the copper foil 28 that are illustrated in FIG. 2A are prepared. A plating resist for forming the conductor posts 36 on the copper foil 28 is formed. The conductor posts 36 are formed on the copper foil 28 that is exposed from the plating resist. The plating resist is removed. The conductive paste 80 is formed in the central region of the copper foil 28. The semiconductor element 90 is mounted on the conductive paste. Thereafter, the lowermost resin insulating layer 50 is formed on the copper foil 28 such that the semiconductor element 90 and the conductor posts 36 are embedded. Thereafter, the processes illustrated in FIGS. 3C, 3D, 4A, 4B and 4C are performed. An intermediate substrate 110 illustrated in FIG. 8C is formed. The intermediate substrate 110 of FIG. 8C is formed by the copper foil 28 and the printed wiring board of the second modified embodiment without the second conductor layer. The intermediate substrate 110 is separated from the support plate 30. The second conductor layer 34 is formed from the copper foil 28 of the intermediate substrate 110. The printed wiring board 10 illustrated in FIG. 1B is completed.

Method for Manufacturing Printed Wiring Board According to Third Modified Embodiment of First Embodiment The intermediate substrate 110 illustrated in FIG. 4D is formed. The lowermost conductor layer 35 is formed from the copper foil 28. The printed wiring board 10 illustrated in FIG. 5C is completed. The printed wiring board 10 of FIG. 5C does not have the lowermost conductor layer 35 below the mounting conductor circuit (34D). However, the lowermost conductor layer 35 can be formed below the mounting conductor circuit (34D) from the copper foil 28.

Method for Manufacturing Printed Wiring Board of Second Embodiment

Figure 9A:
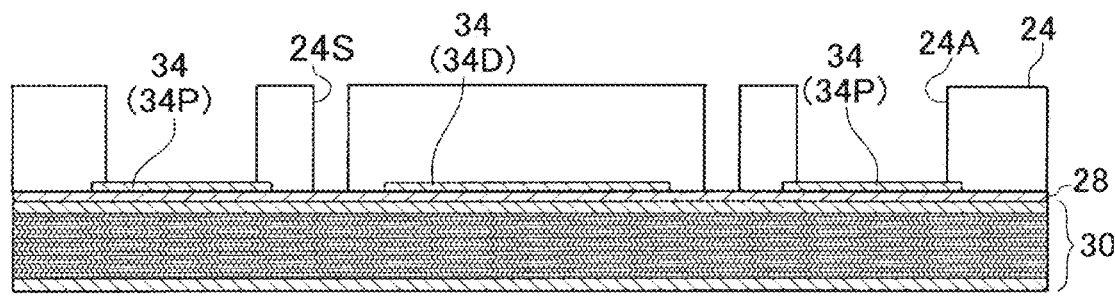
FIG. 9A-9C are manufacturing process diagrams of the printed wiring board of the second embodiment.
Figure 9B:
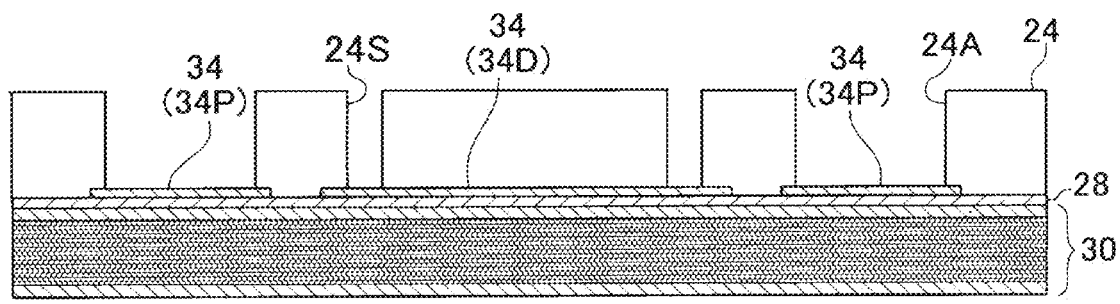

As illustrated in FIG. 2B, the mounting conductor circuit (34D) and the conductor post pads (34P) are formed on the copper foil 28. Thereafter, a plating resist is formed on the copper foil 28, the mounting conductor circuit (34D) and the conductor post pads (34P) (FIG. 9A). The plating resist of FIG. 2C does not have an opening for forming the shield structure 37. In contrast, the plating resist of FIG. 9A has an opening (24S) for forming the shield structure 37. The opening (24S) exposes the copper foil 28 between the mounting conductor circuit (34D) and the conductor post pads (34P). Then, similar to FIG. 2D, the conductor posts 36 and the shield structure 37 are simultaneously formed in the openings (24A, 24S) of the plating resist. Thereafter, the processes after FIG. 3A are performed. The printed wiring board illustrated in FIG. 6A is formed. By changing the shape of opening (24S), the shield structure 37 of FIG. 6B or FIG. 7B is obtained.

In FIG. 6A or FIG. 7A, an opening reaching the shield structure 37 is not formed in the FIG. 3C. In contrast, in FIG. 8D, an opening reaching the first shield structure 371 is formed in FIG. 3C. Then, in FIG. 3D, the second shield structure 372 is formed in the opening reaching the shield structure 37.

Figure 9C:
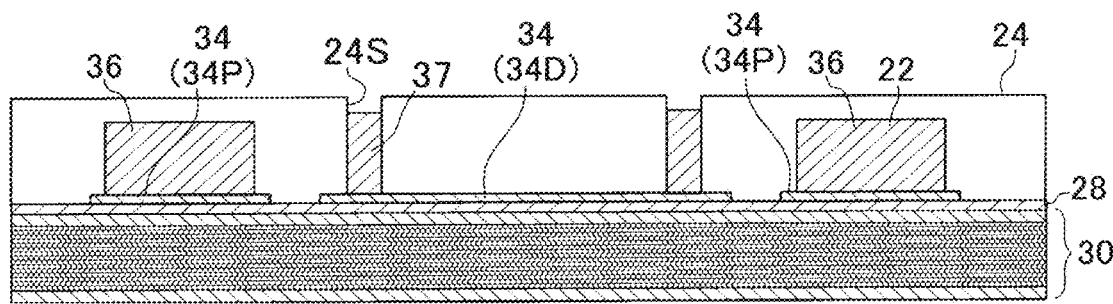

The intermediate substrate illustrated in FIG. 3A is prepared. The intermediate substrate has the first shield layer. Thereafter, a plating resist is formed such that the conductor posts are embedded. The opening (24S) is formed for forming the shield structure 37 in the plating resist (FIG. 9C). The opening (24S) of FIG. 9C reaches the mounting conductor circuit (34D) that forms the first shield layer. The shield structure 37 is formed in the opening (24S) of FIG. 9C. The height of the shield structure 37 is higher than the height of the conductor posts 36. The plating resist of FIG. 9C is removed. Then, the semiconductor element 90 is mounted on the mounting conductor circuit (34D) via the conductive paste. The lowermost resin insulating layer 50 is formed on the copper foil 28 such that the shield structure 37, the conductor posts 36 and the semiconductor element 90 are embedded. By polishing the lowermost resin insulating layer 50, only the shield structure 37 is exposed. Thereafter, as illustrated in FIG. 3C, the openings (51f, 51s) are formed. As illustrated in FIG. 3D, the via conductors (60f, 60s) are formed. At that time, the first conductor layer 58 is formed. The first conductor layer has the first shield layer (58E) that is electrically connected to the shield structure 37. Thereafter, the processes after FIG. 4A are performed. The printed wiring board illustrated in FIG. 6C or FIG. 7C is completed.

In FIG. 2B of Japanese Patent Laid-Open Publication No. 2010-87085, the plating conductor is formed only on an inner wall of the through hole, and the through hole is not filled with the plating conductor. The plating conductor that is formed only on the inner wall of the through hole of Japanese Patent Laid-Open Publication No. 2010-87085 is referred to as a through hole conductor of Japanese Patent Laid-Open Publication No. 2010-87085. The through hole conductor of Japanese Patent Laid-Open Publication No. 2010-87085 penetrates two resin layers and is formed only on the inner wall of the through hole. It is likely that a thermal expansion coefficient of an electronic component and a thermal expansion coefficient of the through hole conductor of Japanese Patent Laid-Open Publication No. 2010-87085 are significantly different. Therefore, when the substrate of Japanese Patent Laid-Open Publication No. 2010-87085 with the built-in electronic component is subjected to heat cycles, reliability of connection via the through hole conductor of Japanese Patent Laid-Open Publication No. 2010-87085 is likely to be low.

A printed wiring board according to an embodiment of the present invention includes: a lowermost resin insulating layer that has a first surface and a second surface that is on an opposite side of the first surface; a semiconductor element that is embedded on the second surface side of the lowermost resin insulating layer and has an electrode that faces the first surface; a conductor post that has an upper surface and a lower surface that is on an opposite side of the upper surface, and is formed in the lowermost resin insulating layer such that the upper surface faces the first surface; a first conductor layer that is formed on the first surface; a first via conductor that is formed in the lowermost resin insulating layer and connects the first conductor layer and the conductor post; and a second via conductor that is formed in the lowermost resin insulating layer and connects the first conductor layer and the electrode.

According to an embodiment of the present invention, the first surface side and the second surface side of the lowermost resin insulating layer, in which the semiconductor element is accommodated, are connected via the conductor post and the first via conductor. A length of the first via conductor is shortened. Therefore, reliability of connection between a conductor on the first surface side and a conductor on the second surface side of the lowermost resin insulating layer, in which the semiconductor element is accommodated, is increased.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a lowermost resin insulating layer;
   a first conductor layer formed on a first surface of the lowermost resin insulating layer;
   a conductor post formed in the lowermost resin insulating layer such that the conductor post has an upper surface facing the first surface and a lower surface on an opposite side with respect to the upper surface;
   a semiconductor element embedded in the lowermost resin insulating layer such that the semiconductor element has an electrode facing the first surface and is positioned on a second surface side of the lowermost resin insulating layer;
   a second conductor layer formed on the second surface side of the lowermost resin insulating layer such that the second conductor layer is connected to the lower surface of the conductor post;
   a shield structure formed between the semiconductor element and the conductor post and surrounding the semiconductor element; and
   a plurality of via conductors formed in the lowermost resin insulating layer and including a first via conductor and a second via conductor such that the first via conductor is connecting the first conductor layer and the conductor post and that the second via conductor is connecting the first conductor layer and the electrode,
   wherein the first conductor layer includes a first shield layer portion formed over the semiconductor element, the second conductor layer includes a second shield layer portion formed underneath the semiconductor element, and the shield structure is formed such that the shield structure is connecting the first shield layer portion of the first conductor layer and the second shield layer portion of the second conductor layer.

2. A printed wiring board according to claim 1, wherein the second conductor layer is embedded into a second surface of the lowermost resin insulating layer such that the second conductor layer has a contact surface connected to the lower surface of the conductor post and an exposed surface exposed from the second surface of the lowermost resin insulating layer.

3. A printed wiring board according to claim 2, further comprising:
   a lowermost conductor layer formed on the exposed surface of the second conductor layer and the second surface of the lowermost resin insulating layer such that the lowermost conductor layer is protruding from the second surface of the lowermost resin insulating layer.

4. A printed wiring board according to claim 3, wherein the second conductor layer includes a conductor post pad portion in direct contact with the lower surface of the conductor post such that the conductor post pad portion has an outer periphery entirely exposed from the conductor post, and the lowermost conductor layer includes a lowermost pad portion in direct contact with the conductor post pad portion of the second conductor layer such that the lowermost pad portion has an outer periphery entirely exposed from the conductor post pad portion of the second conductor layer.

5. A printed wiring board according to claim 2, wherein the conductor post is formed such that a ratio K1/K2 is in a range of from 0.6 or more to 0.9 or less where K1 is a distance between the first surface of the lowermost resin insulating layer and the upper surface of the conductor post, and K2 is a distance between the first surface of the lowermost resin insulating layer and the electrode of the semiconductor element.

6. A printed wiring board according to claim 2, wherein the shield structure is connected to ground and comprising a plurality of shield conductor posts.

7. A printed wiring board according to claim 2, wherein the shield structure is connected to ground and comprising a shield conductor wall.

8. A printed wiring board according to claim 3, wherein the conductor post is formed such that a ratio K1/K2 is in a range of from 0.6 or more to 0.9 or less where K1 is a distance between the first surface of the lowermost resin insulating layer and the upper surface of the conductor post, and K2 is a distance between the first surface of the lowermost resin insulating layer and the electrode of the semiconductor element.

9. A printed wiring board according to claim 1, wherein the second conductor layer is embedded into a second surface of the lowermost resin insulating layer such that the second conductor layer has a contact surface connected to the lower surface of the conductor post and is protruding from the second surface of the lowermost resin insulating layer.

10. A printed wiring board according to claim 7, wherein conductor post is formed such that a ratio K1/K2 is in a range of from 0.6 or more to 0.9 or less where K1 is a distance between the first surface of the lowermost resin insulating layer and the upper surface of the conductor post, and K2 is a distance between the first surface of the lowermost resin insulating layer and the electrode of the semiconductor element.

11. A printed wiring board according to claim 1, wherein the second conductor layer includes a conductor post pad portion in direct contact with the lower surface of the conductor post such that the conductor post pad portion has an outer periphery entirely exposed from the conductor post.

12. A printed wiring board according to claim 11, wherein the conductor post is formed such that a ratio K1/K2 is in a range of from 0.6 or more to 0.9 or less where K1 is a distance between the first surface of the lowermost resin insulating layer and the upper surface of the conductor post, and K2 is a distance between the first surface of the lowermost resin insulating layer and the electrode of the semiconductor element.

13. A printed wiring board according to claim 1, wherein the conductor post has a circular cylinder shape.

14. A printed wiring board according to claim 1, wherein the conductor post is formed such that a ratio K1/K2 is in a range of from 0.6 or more to 0.9 or less where K1 is a distance between the first surface of the lowermost resin insulating layer and the upper surface of the conductor post, and K2 is a distance between the first surface of the lowermost resin insulating layer and the electrode of the semiconductor element.

15. A printed wiring board according to claim 1, wherein the second conductor layer includes a semiconductor element mounting portion on which the semiconductor element is mounted.

16. A printed wiring board according to claim 1, wherein the second conductor layer has a roughened surface on the second surface side of the lowermost resin insulating layer.

17. A printed wiring board according to claim 1, wherein the shield structure is connected to ground and comprising a plurality of shield conductor posts.

18. A printed wiring board according to claim 1, wherein the shield structure is connected to ground and comprising a shield conductor wall.

19. A printed wiring board according to claim 18, wherein the shield conductor wall of the shield structure has an opening portion.

20. A printed wiring board according to claim 18, wherein the shield conductor wall of the shield structure is formed such that the shield conductor wall is completely surrounding the semiconductor element.

* * * * *